United States Patent [19]

Boucher

[11] Patent Number: 5,070,486
[45] Date of Patent: Dec. 3, 1991

[54] PROCESS TO INCREASE THE POWER OF THE LOW FREQUENCY ELECTRO ACOUSTIC TRANSDUCERS AND CORRESPONDING TRANSDUCERS

[75] Inventor: Didier Boucher, Six Fours les Plages, France

[73] Assignee: Et Francais, Paris, France

[21] Appl. No.: 629,650

[22] Filed: Dec. 7, 1990

[30] Foreign Application Priority Data

Dec. 7, 1989 [FR] France .................................. 89 16172

[51] Int. Cl.$^5$ .............................................. H04R 17/00
[52] U.S. Cl. ...................................... 367/155; 367/157; 367/159; 367/168; 310/334; 310/367
[58] Field of Search ................ 367/155, 156, 157, 158, 367/159, 163, 168; 310/322, 334, 337, 367

[56] References Cited

U.S. PATENT DOCUMENTS

| 2,988,728 | 6/1961 | Marlow | 367/158 |
| 3,183,378 | 5/1965 | McCracken | 310/325 |
| 3,495,102 | 2/1970 | List et al. | 310/338 |
| 4,894,811 | 1/1990 | Porzio | 367/163 |

Primary Examiner—Deborah L. Kyle
Assistant Examiner—J. Woodrow Eldred
Attorney, Agent, or Firm—Oliff & Berridge

[57] ABSTRACT

An electroacoustic transducer according to the invention comprises a stacking of annular plates (13) made of piezoelectric ceramics alternating with annular electrodes (14) and pressed by an axial prestressing stem (15). The contact faces between each plate and the adjacent ones are made of two flat parts (16a, 16b) whose surface is smaller than the maximum cross section, due to the chamfers (19a, 19b, 20a, 20b) which truncate the edges of each plate. One application is the construction of low frequency sonar transmitters. Referenced elements refer to FIG. 3.

7 Claims, 4 Drawing Sheets

PROCESS TO INCREASE THE POWER OF THE LOW FREQUENCY ELECTRO ACOUSTIC TRANSDUCERS AND CORRESPONDING TRANSDUCERS

FIELD OF THE INVENTION

The present invention relates to methods to increase the power of the low frequency electroacoustic transducers as well as the transducers obtained by these methods.

The technical field of the invention is the construction of electroacoustic transducers, (piezoelectric or magnetostrictive) used to build acoustic wave transmitters used as sonar transmitters.

BACKGROUND

To date, most of the sonar transmitters with a high power in low frequency, i.e. for frequencies ranging between 100 Hz and 10 kHz, generally comprise an engine, which is made of one or more stacks of electroacoustic plates, usually piezoelectric ceramics separated by electrodes.

Thus, the transducers known under the name of Tonpilz comprise a stack of similar plates, which are placed between a flare and a countermass and which are crossed by a stem which connects the flare to the countermass and which is energized to keep the plates pressed.

Transducers named "flextensional" are also known which comprise one or more stackings of similar electroacoustic plates laid out along the large axis of an envelope having an elliptic-shaped section.

Most of the time, the plates constituting a stacking are piezoelectric ceramics rings, with a plane lateral surface, which are separated by electrodes, so that the stacking has the shape of a straight cylinder with a circular section. In U.S. Pat. Nos. 2,988,728 and 3,495,102, the presented stackings have circular or annular plates which are chamfered for a better distribution of the stresses and to increase the distance between the electrodes in order to reduce the risk of breakdown.

Whatever is the geometrical shape of the plates, chamfered or not, the dimensioning of stacking is carried out mainly by determining the number and dimensions (thickness and diameter) of the plates for the considered frequency to be equal to the resonance frequency of the stacking.

However, for this type of dimensioning, the conditions required to obtain a low resonance frequency are in contradiction with those required to obtain a high power of emission, thus the realization of high power transducers is not possible.

Indeed, the resonance frequency F of a stacking is as follows $$F = \frac{1}{2\pi \sqrt{e \times m}}$$

formula in which e represents the elasticity and m the mass of the stacking. The mass m being limited by limitations of weight and dimensions not to be exceeded, the coefficient on which it is possible to act is thus the elasticity e of the stacking. However, the elasticity:

$$e = \frac{L}{Y \times S}$$

formula in which Y is the Young's module, L the length and S the contact surface between the plates which is equal to the cross section of the plates.

The length L being also limited by limitations of dimensions not to be exceeded, the coefficient on which it is possible to act to reduce the resonance frequency by increasing elasticity is thus the section S which must be reduced.

The acoustic power Pa emitted by a stacking of piezoelectric ceramic plates is expressed by the following formula $Pa = V \cdot w \cdot E^2 \cdot k^2 \cdot \epsilon \cdot Qm$, formula in which V is the volume of the stacking, w the pulsation corresponding to the frequency, E the electric field applied to the stacking which is limited by the ceiling voltage, k the electromechanical coupling coefficient of the ceramics which depends on the kind of material, $\epsilon$ the dielectric constant of the ceramics and Qm a coefficient of quality which depends on the width of the passband and which is thus imposed by the choice of this width. This formula shows that the volume V of the stacking is one of the coefficients on which it is possible to act to increase the emitted power.

In the case of a straight cylindrical bar, the volume V is equal to the product of the length by the cross section.

As it has been already explained, the maximum length L is limited for reasons of dimensions.

If the cross section S is increased, the emitted power is increased, but as it has been explained previously, the elasticity of the stacking is reduced and thus the resonance frequency is increased, thus it is obvious that the choice of dimensions (thickness and diameter of the plates) as well as their number, is not sufficient to obtain at the same time a high power and a low frequency of emission.

SUMMARY OF THE INVENTION

The object of this invention is to provide transducers made of a stacking of electroacoustic, piezoelectric or magnetostrictive plates, which can emit a high power with a low frequency.

This object is achieved by a process according to which the edges of the electroacoustic plates constituting a stacking are truncated, so that the surfaces of contact of each plate with the adjacent ones in the stacking are reduced to two flat parts whose surface is smaller than the maximum cross section of each plate.

Preferably, the relationship between the surface of the flat parts of contact and the maximum cross section of the plates is lower than 0.8.

A low frequency electroacoustic transducer according to the invention is of the known type comprising a stacking of similar electroacoustic plates forming a bar which vibrates longitudinally when it is electrically excited.

An electroacoustic transducer according to the invention is characterized by the fact that the contact surfaces of each plate with the adjacent ones in the aforementioned stacking, are made of two flat parts, whose surface is smaller than the maximum cross section of the aforesaid plates. The result of the invention is electroacoustic transducers, particularly piezoelectric or magnetostrictive transducers, which can emit at low frequency a power higher than the power of the transducers known to date.

The power gain can reach 50%. This gain is obtained thanks to a gain of sensitivity without increasing the power of excitation nor the weight or dimensions. On the contrary, truncations and chamfers which characterize the transducers according to the invention permit decreasing the weight while increasing the power.

BRIEF DESCRIPTION OF THE DRAWINGS

The following description refers to the enclosed drawings which represent, without any limitation, examples of realization of electroacoustic transducers according to the invention.

DESCRIPTION OF THE PREFERRED EMBODIMENTS

Figure 1:
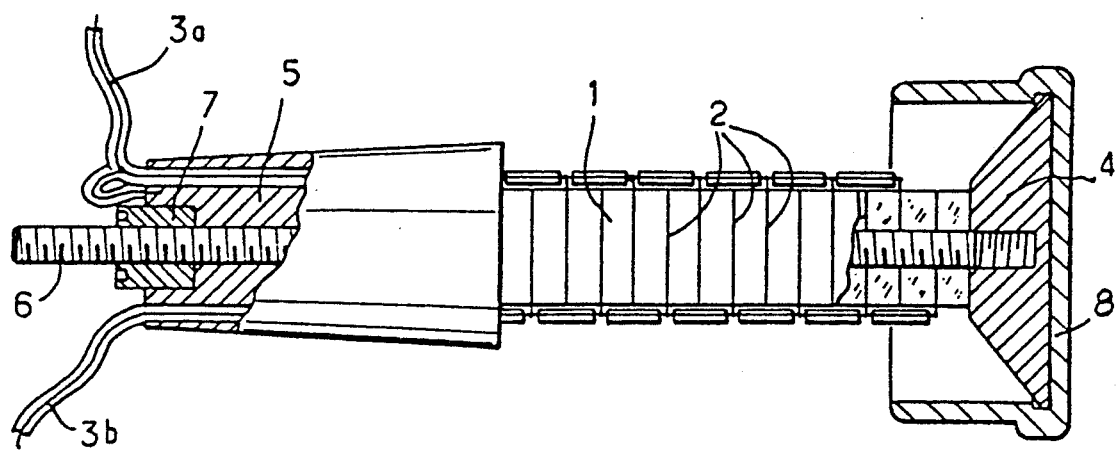
FIG. 1 is a partial broken-out section of a known Tonpilz type piezoelectric transducer.

FIG. 1 represents a Tonpilz type piezoelectric transducer. This transducer comprises a piezoelectric engine made of a stacking of piezoelectric ceramic rings 1, which are separated by the electrodes 2 which are connected alternatively on two electric wires 3a and 3b, which connect the transducer to an electronic oscillator not represented.

The ceramics stacking is laid out between a flare 4 and a countermass 5.

An axial stem 6 is screwed in flare 4. It passes in a drilled axial boring through rings 1, the electrodes and countermass 5. A nut 7 is screwed on the loose end of the stem 6 which is threaded and the tightening of nut 7 allows to make stem 6 tight and to constantly maintain the ceramics rings pressed.

The front face of the flare 4, which is in contact with water is covered by an envelope 8, made of an acoustically transparent material, for example rubber.

Such Tonpilz type transducers are well known and usually they are used to constitute the sonar transmitters used to transmit acoustic waves in water.

Figure 2:
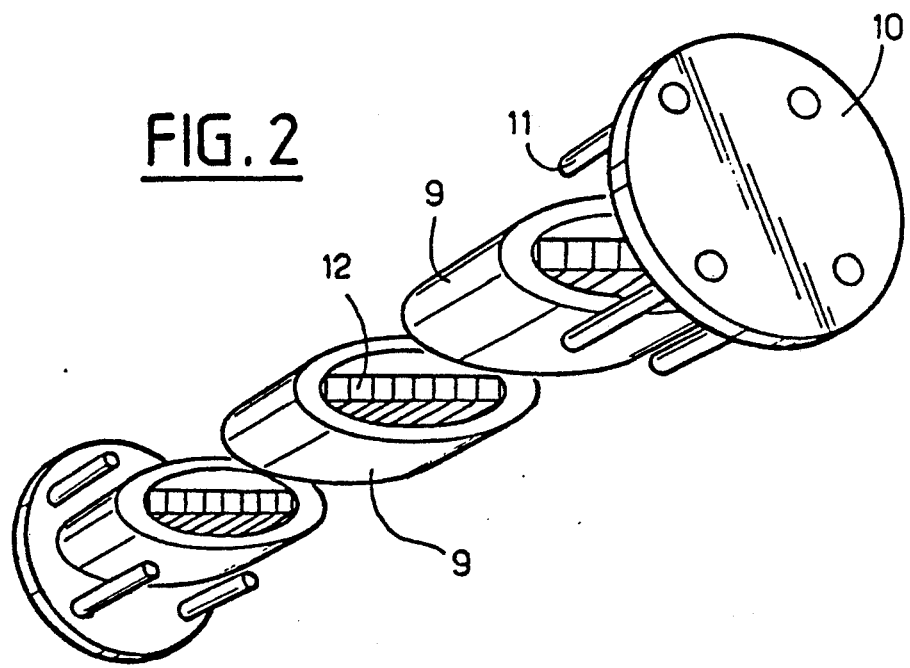
FIG. 2 is a perspective exploded view for a known piezoelectric transducer of the type known as "flextensional".

The piezoelectric ceramics stacking forms a bar oscillating longitudinally when it is electrically energized. FIG. 2 represents a transducer of the type known as "flextensional". This transducer comprises several rigid, hollow and similar envelopes 9, with an elliptic cross-section, laid out end to end between two end plates 10 connected to each other by stems 11. Each envelope 9 contains a stacking 12 of piezoelectric plates. The axis of the stacking is mixed up with the large axis of the elliptic envelope.

The piezoelectric plates alternate with electrodes alternatively connected to one or the other of two wires which are connected on an electronic oscillator, allowing to energize the plates. The axial oscillations of the plates are transmitted to the envelopes 9 which amplify them and which transmit them to the water in the case of a sonar transmitter. Piezoelectric stackings of plates alternating with electrodes, may be replaced by a ferromagnetic cylindrical bar in the case of magnetostrictive transducers.

The object of the present invention is the electroacoustic transducers of the Tonpilz type or of the type known as "flextensional" comprising a stacking of similar plates which allow to emit a high power on low frequencies ranging between 100 Hz and 10 Hz.

Figure 3:
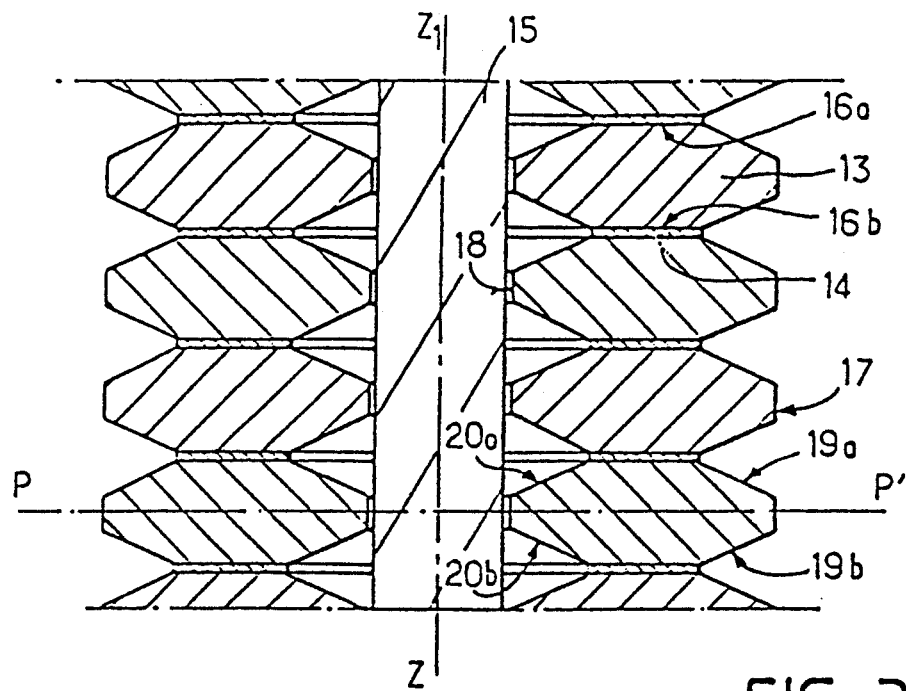
FIG. 3 is a partial axial section of a first form of realization of a stacking of piezoelectric plates of a transducer according to the invention.

FIG. 3 is a partial axial section of a mode of realization of a piezoelectric ceramics stacking constituting the engine of a transducer according to the invention of the Tonpilz type or one of the engines of a transducer of the "flextensional" type.

According to this method of realization, the stacking is made of similar plates 13 separated by electrodes 14, which are connected to an electronic oscillator by wires not represented.

Each plate has the shape of a ring of axis zz1 which is axially bored and through which passes a stem 15 to be prestressed, to maintain the plates the ones against the others. Each plate 13 presents two faces 16a and 16b perpendicular to the axis zz1 which are in contact with the two faces of an electrode 14 intercalated between the two plates.

Moreover, each plate has an external periphery 17 and an internal periphery 18. These external and internal peripheries are two concentric cylindrical surfaces of axis zz1.

Each plate comprises a plane of symmetry PP' perpendicular to axis zz1.

According to a characteristic of the invention, each plate 13 comprises at its external periphery two chamfers 19a and 19b, which are symmetrical compared to plane PP'.

Moreover, each plate comprises at its internal periphery, two other chamfers 20a and 20b which are also symmetrical compared to plane PP'.

Chamfers 19a, 19b, 20a and 20b are made of truncated surfaces of axis zz1.

Thus, the surfaces 16a and 16b perpendicular to axis zz1 which are used as contact surfaces between two plates by means of an electrode, are annular flat parts, whose surface S1 is smaller than the maximum cross-section S2 of each electrode by a plane perpendicular to axis zz1.

The result is that the resonance frequency F of the stacking is low as this frequency is inversely proportional to the square root of the elasticity of the stacking, which elasticity is inversely proportional to the surface of contact between the successive plates. On the other hand, the power emitted by the stacking is proportional to the volume of the stacking which is equal to the length of this one, multiplied by an intermediate cross section between the maximum cross-section of the plates and the surface of contact between the electrodes.

Compared with annular plates of the same external and internal diameter which are not chamfered, the plates chamfered by coaxial truncated surfaces with the stacking thus allow to obtain, with a nearly similar power, a lower frequency of emission or for the same frequency a higher power of emission, the power gain being able to reach 50%.

FIG. 3 represents a preferential form of realisation in which the electrodes 14 do not cover the chamfered surfaces 19a, 19b, 20a, 20b. They cover only the surfaces 16a and 16b with contact between the successive plates. This preferred layout of the electrodes is chosen as the electric field pattern between the positive and negative electrodes located on both sides of a plate are longer than in the case of cylindrical-ring-shaped plates and of electrodes extending on all the cross-section of the plates, thus reducing the risks of breakdown in operation by a discharge going round the plates and thus allowing to use a higher excitation voltage and thus to increase the power.

As an alternative, the electrodes 14 can cover the flat parts and all or part of the chamfers 19a, 19b.

Figure 4:
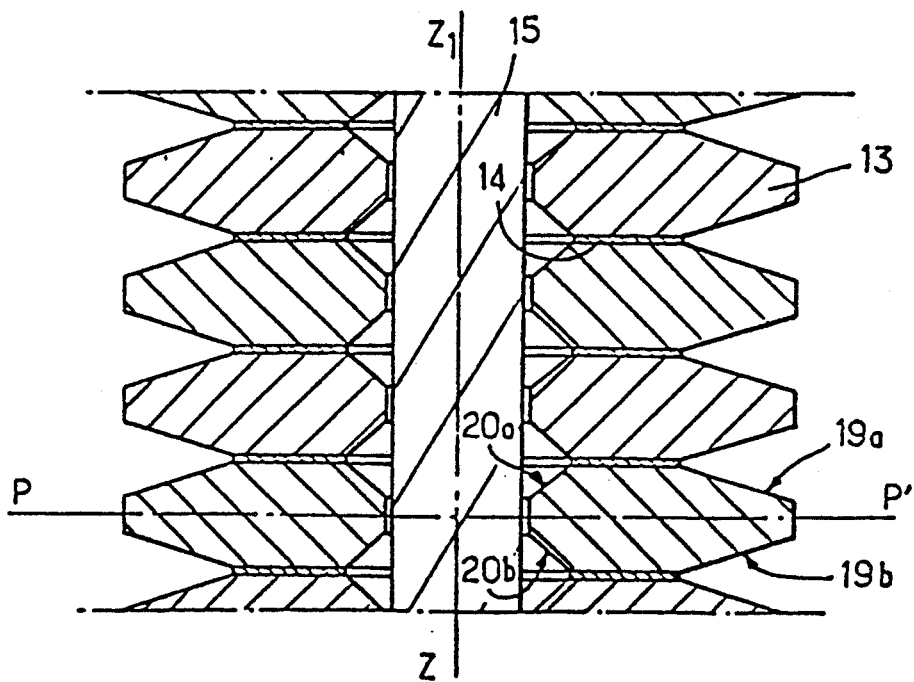
FIG. 4 is a partial axial section of a second form of realization of a stacking of piezoelectric plates of a transducer according to the invention.

FIG. 4 represents a partial axial section of another form of realization of a transducer according to the invention which also comprises piezoelectric ceramic stacking 13 separated by the electrodes 14. Ceramics 13 are axially bored rings in which passes a prestressing stem 15. The external periphery of each ring is chamfered by two truncated surfaces 19a, 19b centered on axis zzl and symmetrical compared to a plane PP' perpendicular to axis zzl. The internal periphery of each ring is also chamfered by two truncated surfaces 20a 20b symmetrical compared to plane PP'.

The only difference between the forms of realization represented on FIGS. 3 and 4 lies in the fact that in the case of FIG. 3, chamfers 20a and 20b are symmetrical to chamfers 19a and 19b compared to a cylindrical vertical median surface, while in the case of FIG. 4, they are not symmetrical.

Figure 5:
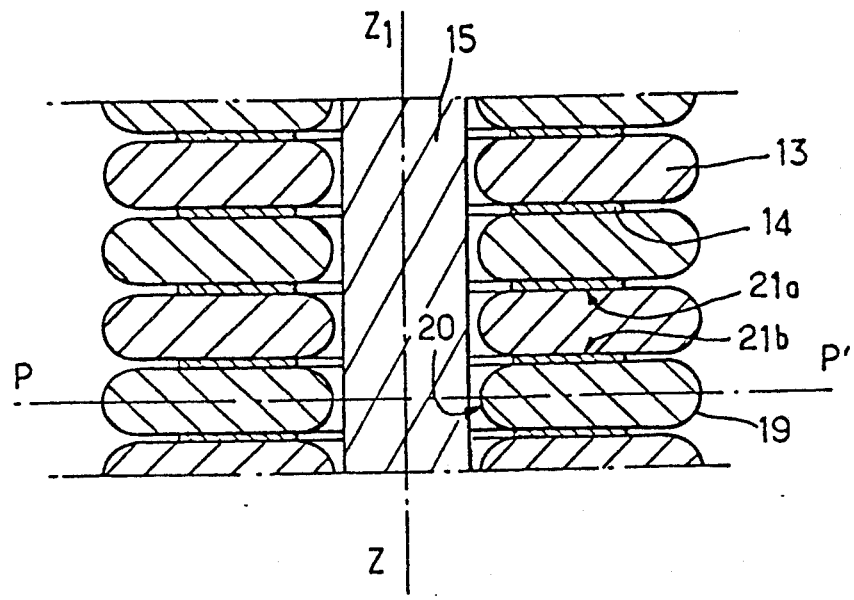
FIG. 5 is a partial axial section of a third mode of realization.

FIG. 5 represents another form of realization of a piezoelectric ceramics stacking 13 alternating with electrodes 14 and constituting the active engine of an electroacoustic transducer used as a sonar transmitter.

The electrodes 13 have the general shape of rings axially bored in which passes a prestressing stem 15.

The higher and lower edges of the external periphery of each ring are truncated by a toric surface 19 centered on axis zzl. Similarly, the higher and lower edges of the internal periphery of each ring are truncated by a toric surface 20 centered on axis zzl. Thus, each ring has the general shape of a flattened torus comprising two annular flat parts 21a and 21b on its higher and lower faces, which are used as a backing face for the rings one on the other, through the annular electrodes 14, whose surface corresponds to the surface of the flat parts 21a and 21b.

S1 is the surface of the flat parts and electrodes and S2 is the maximum cross section of a ring by the plane of symmetry PP'.

Tests carried out while varying ratio S1/S2 indicated that it was possible to obtain transmitters in low frequency having a power increased of approximately 50% when the ratio S1/S2 is lower than 0.8.

FIGS. 3, 4 and 5 represent forms of realization of stackings of ring-shaped plates which is the most usual shape.

It is however specified that the present invention is not limited to circular plates. It can also apply to rectangular or square or polygonal plates, then the higher and lower edges on two opposite sides or on the four sides of the external periphery are chamfered and it is also possible to chamfer the internal periphery if these plates are bored to allow the passage of a prestressing stem.

Figure 6:
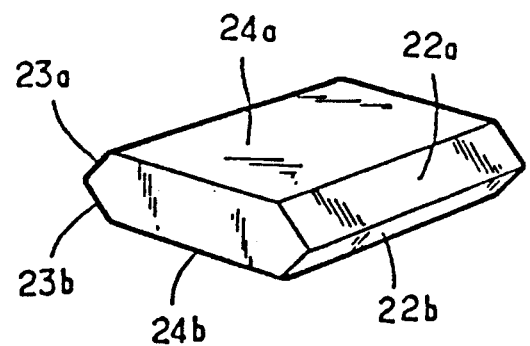
FIG. 6 is a view in perspective of a rectangular piezoelectric plate.

FIG. 6 represents an example of a rectangular plate of which two opposite sides are truncated, each one by two chamfers, respectively the chamfers 22a and 22b and 23a and 23b, so that each plate might laid on two other plates by two flat parts 24a and 24b whose surface S1 is smaller than the greatest cross section S2.

The previous examples of realization refer to stackings of piezoelectric plates alternating with electrodes.

Magnetostrictive transducers comprising a bar made of a ferromagnetic material excited by a coil are also used.

It is specified that the present invention can also apply to this type of transducers. In that case, the ferromagnetic bar is cut out in sections or plates and each plate comprises, on its faces which are in contact with two other plates, flat parts whose surface is smaller than the maximum cross section of the bar, so that the elasticity of the bar is increased without reducing the total volume appreciably, thus it is possible to emit on a low frequency, while having a high power of emission.

Figure 7:
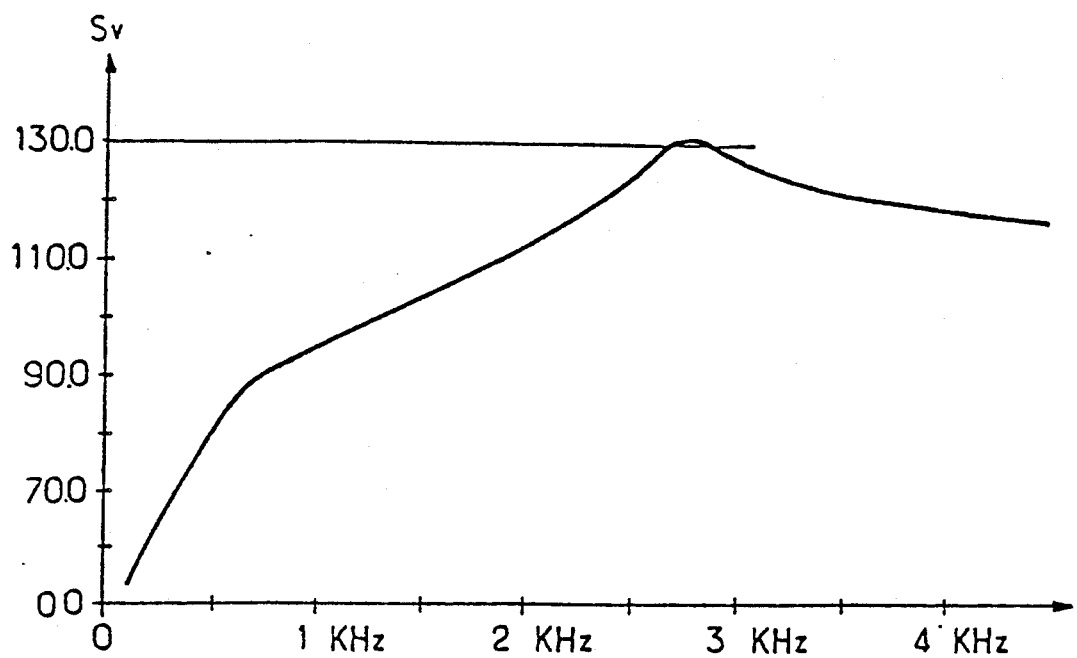
FIGS. 7 and 8 are comparative diagrams of the sensitivity of a known transducer and of a transducer according to the invention.
Figure 8:
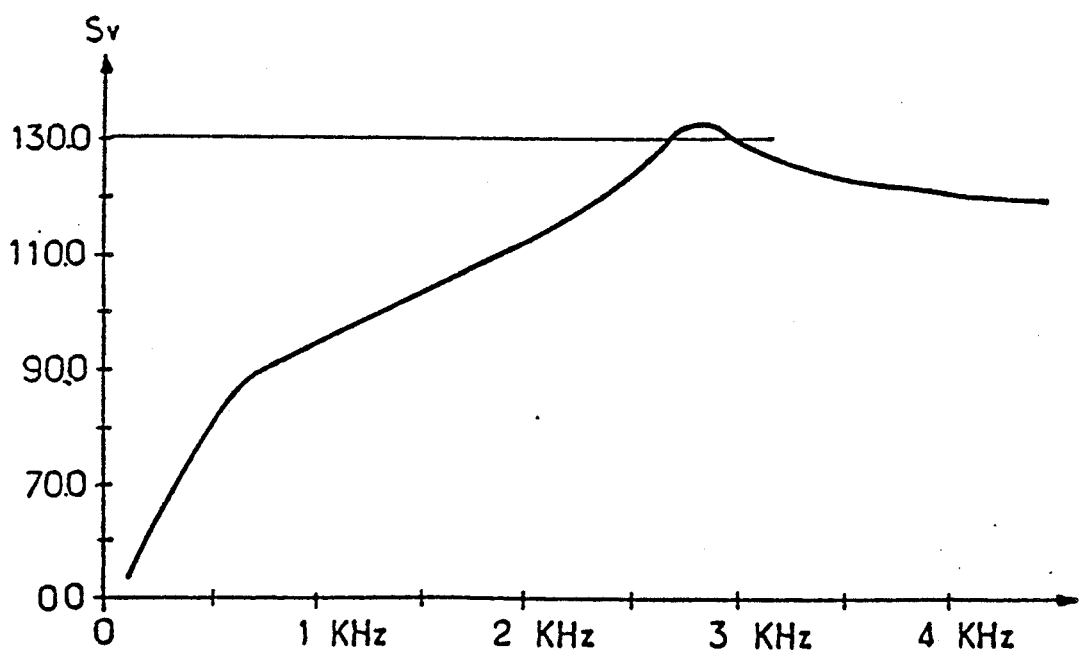

FIGS. 7 and 8 represent comparative measurements. These two faces represent in X-coordinates the frequencies ranging between 0 and 4 KHz and in ordinates the sensitivity in decibels per volts (reference 1 $\mu$Pa to 1 meter).

FIG. 7 shows the sensitivity reached with a traditional transducer of the Tonpilz type, i.e. a transducer comprising annular piezoelectric ceramics.

It can be seen that a maximum sensitivity of about 131 decibels is reached for a frequency of approximately 2.8 KHz.

FIG. 8 shows the results reached with the same Tonpilz type transducer when replacing annular ceramics by ceramics comprising flat parts with a surface S1 equal to 0.8 times the maximum cross section of ceramics. The curve obtained shows that a maximum sensitivity of about 133 dB for an unchanged resonance frequency is reached. The gain of 2 dB corresponds to a gain of acoustic power of about 50% for the same electric voltage.

What is claimed is:

1. A process to increase the power emitted by a low frequency electroacoustic transducer made of a stack of electroacoustic plates, comprising truncating edges of the plates so that contact surfaces of each plate with adjacent plates in the stack are reduced to two flat parts whose surface area is smaller than a maximum cross section area of each plate, an outline of a cross section of said truncated edges being symmetrical about a line in a plane of said maximum cross section area.

2. The process defined in claim 1, wherein said stack of a electroacoustic plates comprises a stack of piezoelectric annular ceramic plates alternating with annular electrodes, wherein: an external periphery and an internal periphery of each plate is truncated by at least one of chamfered surfaces and toric surfaces; said two flat parts comprise two annular flat parts; and a said annular electrode having the same surface as the annular flat parts is intercalated between the annular flat parts of two adjacent plates.

3. A process to increase the power emitted by a low frequency electroacoustic transducer made of a stack of electroacoustic plates, comprising truncating edges of the plates so that contact surfaces of each plate with adjacent plates in the stack are reduced to two flat parts whose surface area is smaller than a maximum cross section area of each plate, wherein the ratio between the surface area of the flat parts and the maximum cross section area of the plates is smaller than 0.8.

4. A low frequency electroacoustic transducer of the type comprising a stack of essentially identical electroacoustic plates forming a bar which vibrates longitudinally when electrically energized, wherein surfaces of each plate in contact with adjacent plates in the stack are comprised of two flat parts whose surface area is smaller than a maximum cross section area of the plates, wherein said stack of essentially identical electroacoustic plates comprises a stack of piezoelectric ceramic rings separated by electrodes intercalated between said rings and a prestressing stem that crosses axially through a boring in said stack, and wherein an external periphery and an internal periphery of each ring is truncated, so that each ring presents on each contact face an annular said flat part.

5. The electroacoustic transducer defined in claim 4, wherein each truncated ring is truncated by chamfered surfaces, and wherein said chamfered surfaces are coaxial with said prestressing stem.

6. The electroacoustic transducer defined in claim 4, wherein each truncated ring is truncated by toric surfaces, and wherein said toric surfaces are coaxial with said prestressing stem.

7. A low frequency electroacoustic transducer of the type comprising a stack of essentially identical electroacoustic plates forming a bar which vibrates longitudinally when electrically energized, wherein surfaces of each plate in contact with adjacent plates in the stack are comprised of two flat parts whose surface area is smaller than a maximum cross section area of the plates, an outline of a cross section of said truncated edges being symmetrical about a line in a plane of said maximum cross section area;

wherein said electroacoustic plates comprise magnetostrictive ferromagnetic plates.

* * * * *